United States Patent [19]

Casteel et al.

[11] Patent Number: 5,854,672
[45] Date of Patent: Dec. 29, 1998

[54] VACUUM EXPOSURE FRAME WITH UNWORKED GLASS INSERT/PLATE EXPOSER AND OPTIONALLY HAVING SEPARATE ID VIEWING AREA

[75] Inventors: Janet Casteel, Harrisonburg; Shawn Benson, Criders, both of Va.

[73] Assignee: R. R. Donnelley & Sons Company, Chicago, Ill.

[21] Appl. No.: 399,632

[22] Filed: Mar. 7, 1995

[51] Int. Cl.$^6$ .......................... G03B 27/58; G03B 27/20
[52] U.S. Cl. .................. 355/73; 355/91; 355/128
[58] Field of Search .................... 355/76, 91, 122, 355/40, 94, 128, 131, 73

[56] References Cited

U.S. PATENT DOCUMENTS

| | | | |
|---|---|---|---|
| 3,634,009 | 1/1972 | Van Dusen et al. | 355/128 X |
| 3,751,250 | 8/1973 | Moscony et al. | 355/91 X |
| 4,089,603 | 5/1978 | Jacobs | 355/91 X |
| 4,324,474 | 4/1982 | Kraemer et al. | 355/76 X |
| 4,533,240 | 8/1985 | Jasperson | 355/128 X |
| 4,607,953 | 8/1986 | Farris | 355/91 |
| 4,827,316 | 5/1989 | Brown | 355/94 X |
| 4,896,186 | 1/1990 | Tokuda | 355/40 |
| 4,948,539 | 8/1990 | Byers | 355/122 X |
| 5,017,960 | 5/1991 | Tuulse | 355/91 |

*Primary Examiner*—Fred L. Braun
*Attorney, Agent, or Firm*—Samuel Shipkovitz; James J. Hamill

[57] ABSTRACT

An improved vacuum exposure frame for use in making exposed aluminum printing or lithographic plates permits the use of unworked glass, preferably tempered glass, rather than polycarbonate plexiglass (which is easily scratched) of the prior art replacement of the transparent image-exposure-window material. The frame is routed on the lower aperture-facing portion of the exposure window, preferably by a 90° routing having a horizontal face and a vertical face surrounding and defining the aperture underside. A preferred embodiment has a reverse depression preferably routed out of the horizontal face and a sealant-adhesive is inserted into the reverse depression and along the vertical face so as to secure the unworked glass to the frame. Separate ID windows with long lasting polycarbonate inserts are also in the frame where the main image exposure window aperture is shaped to contain preferably only the book pages to be exposed onto the aluminum plate. Additionally, glued polycarbonate vacuum towers of the prior art are replaced by aluminum vacuum towers threadably mechanically secured to the frame and not involved with the windows and their usage.

24 Claims, 10 Drawing Sheets

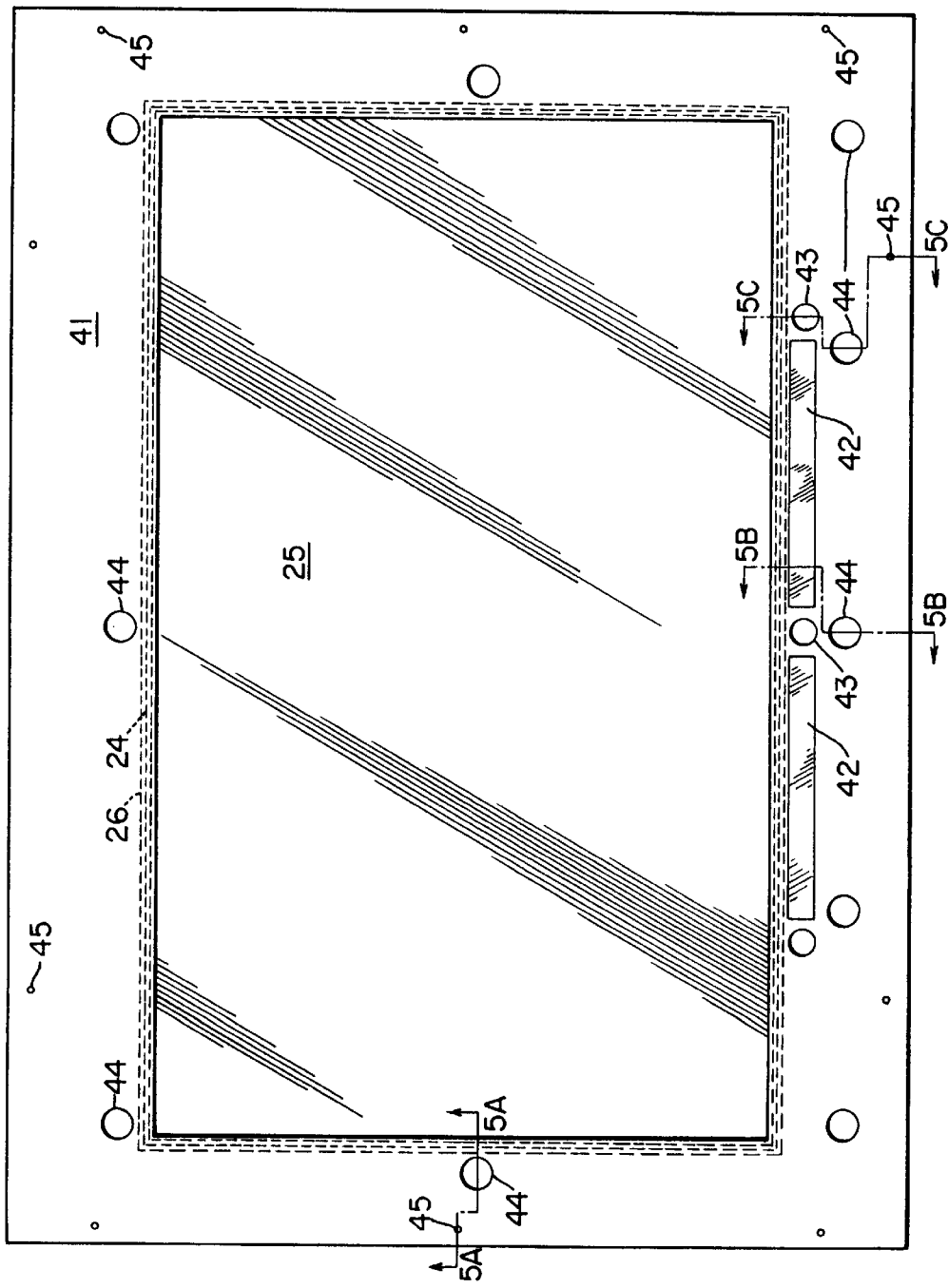

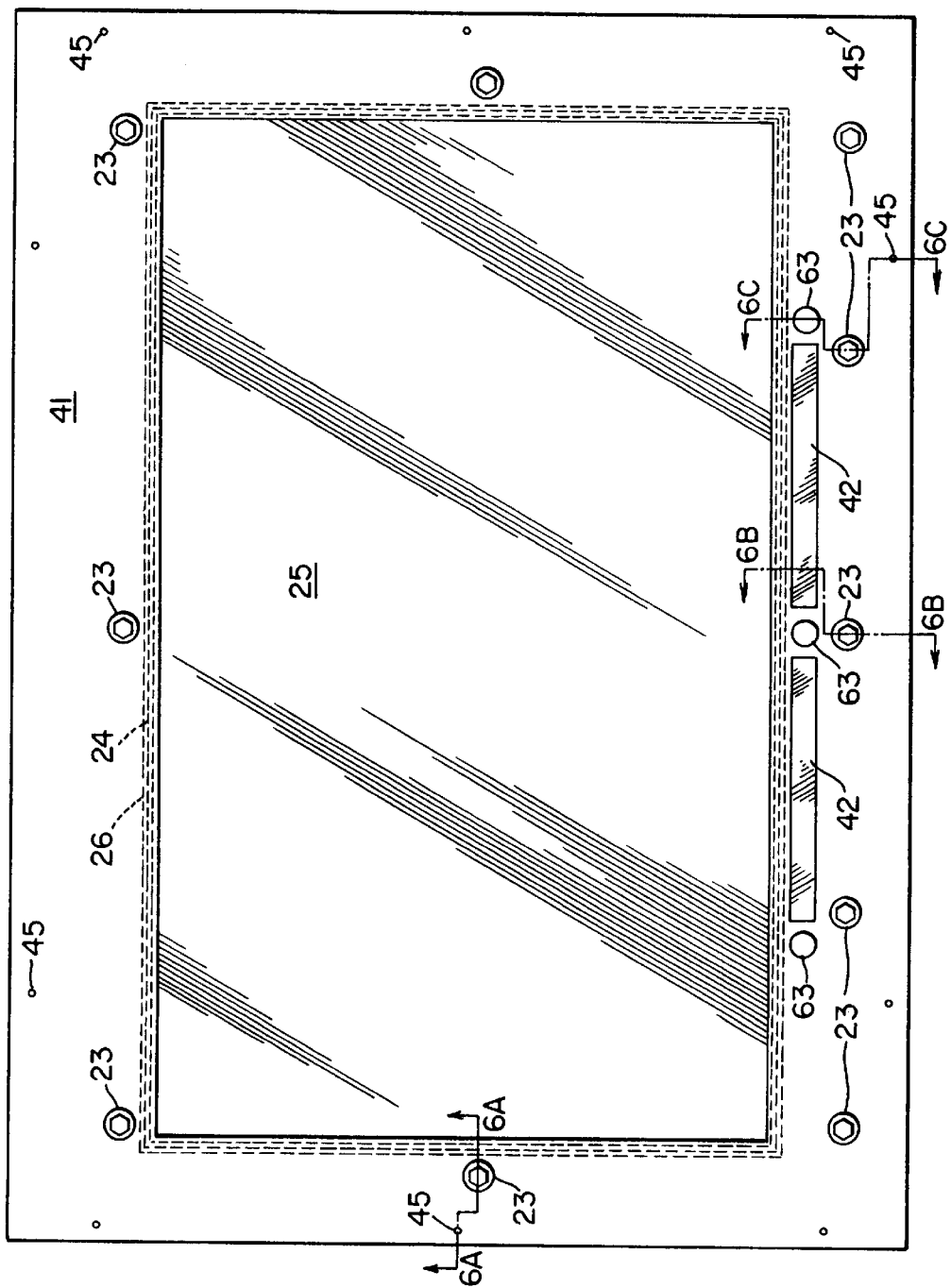

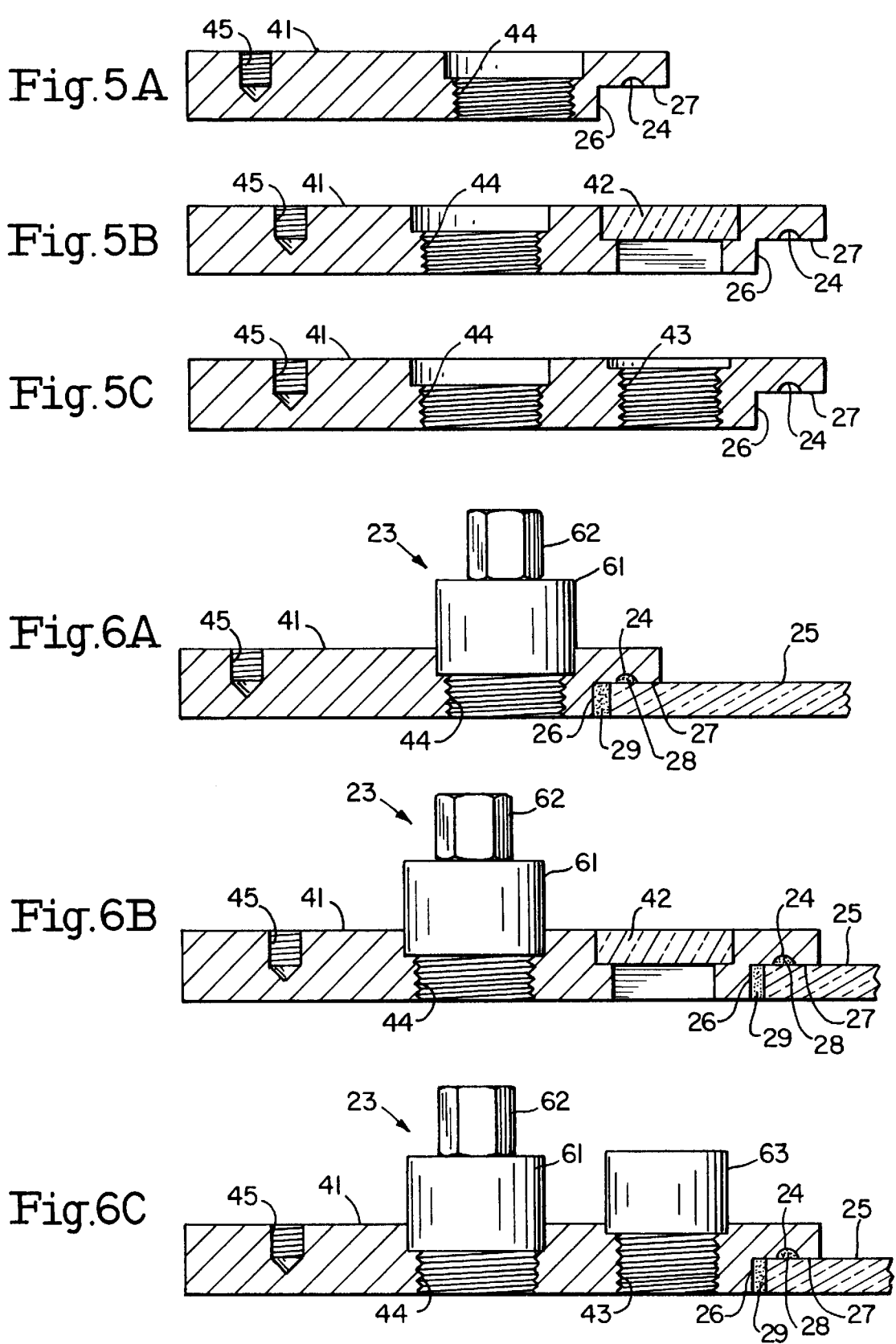

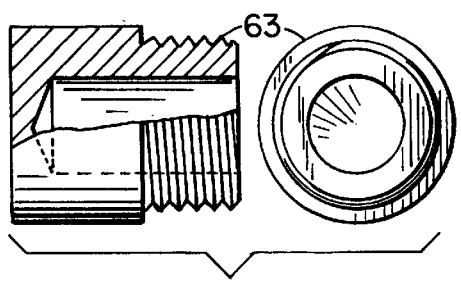
Fig.7A
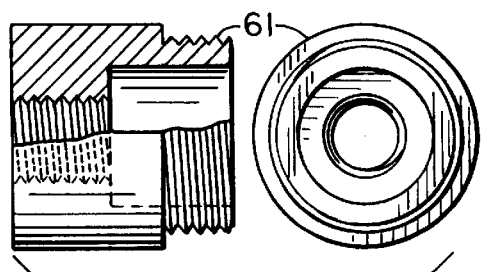
Fig.7B
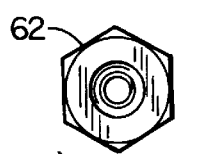 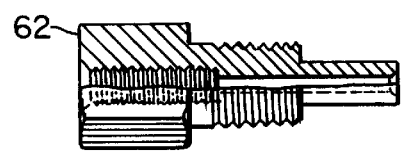 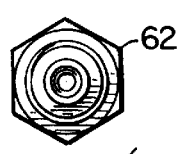
Fig.7C
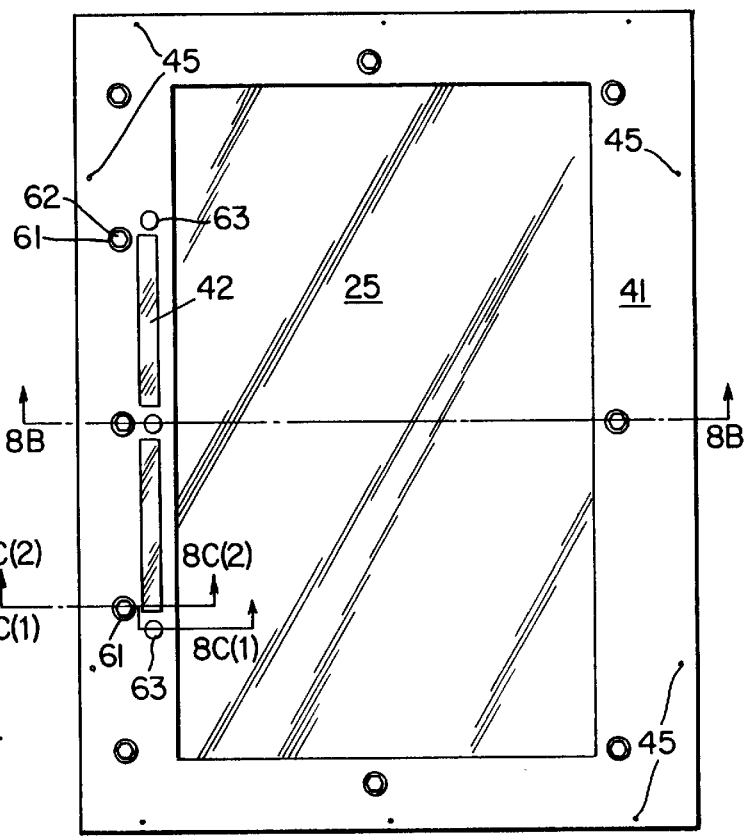
Fig.8A
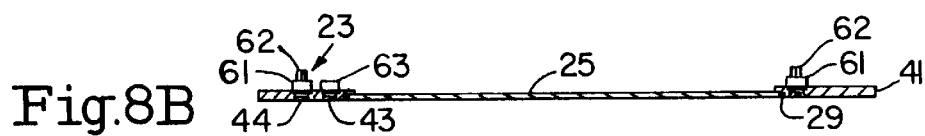
Fig.8B

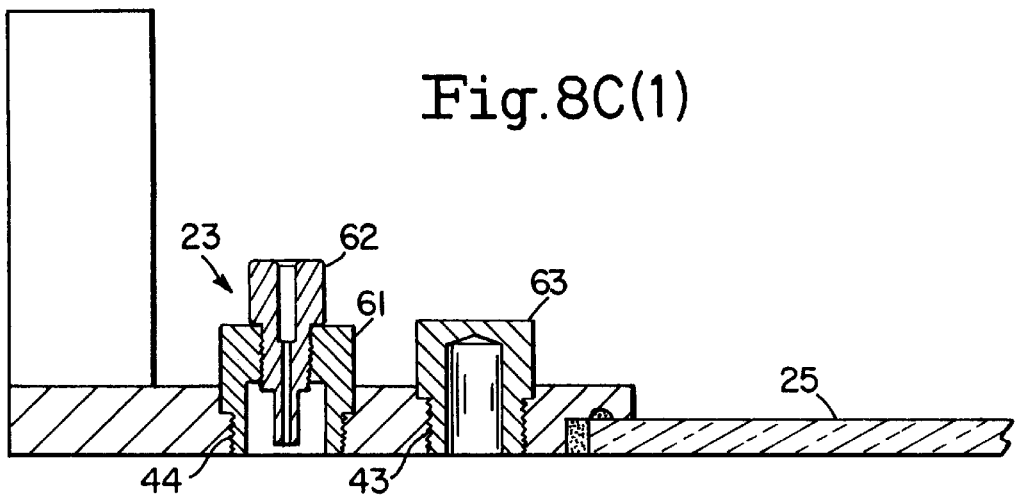
Fig.8C(1)
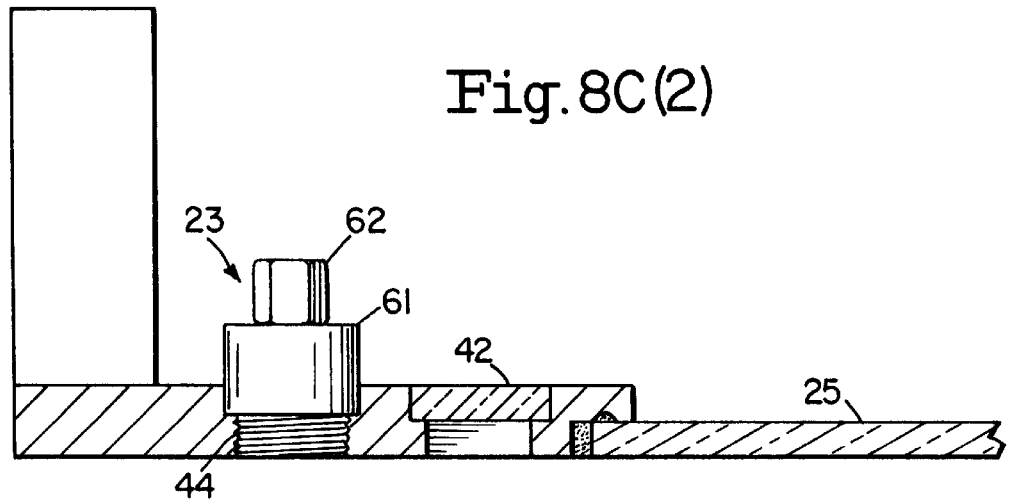
Fig.8C(2)
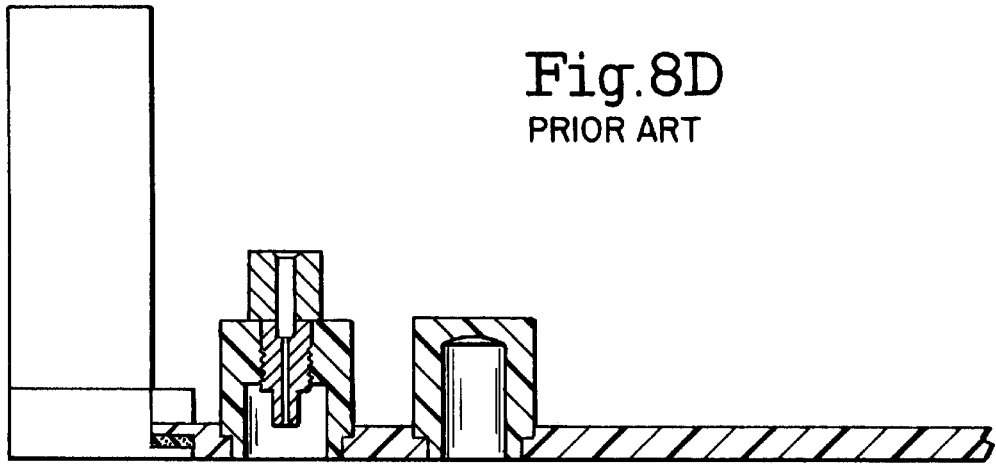
Fig.8D
PRIOR ART

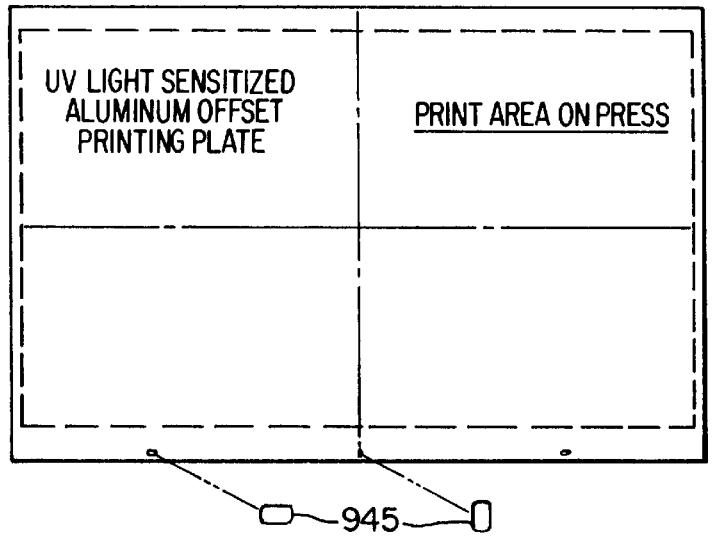
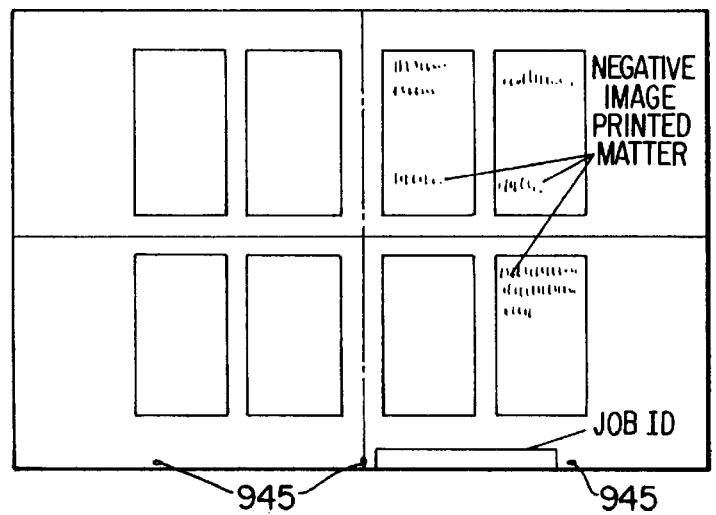
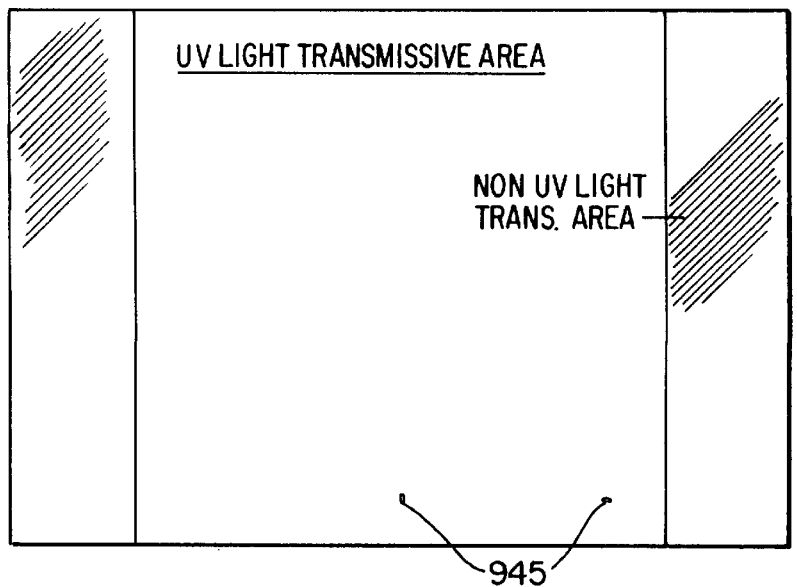

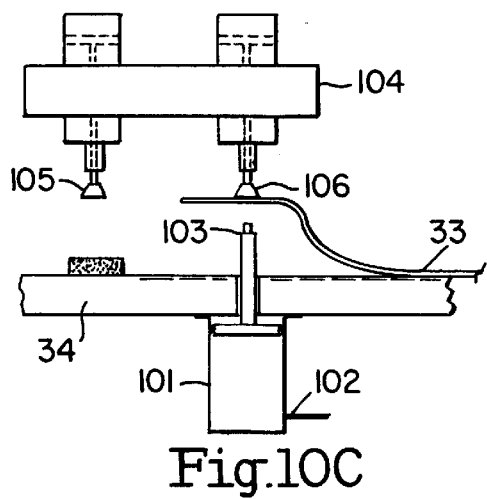
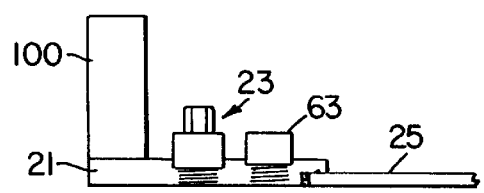
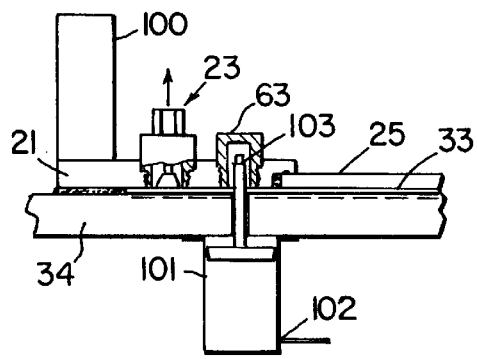
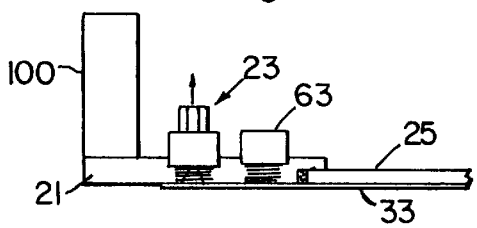
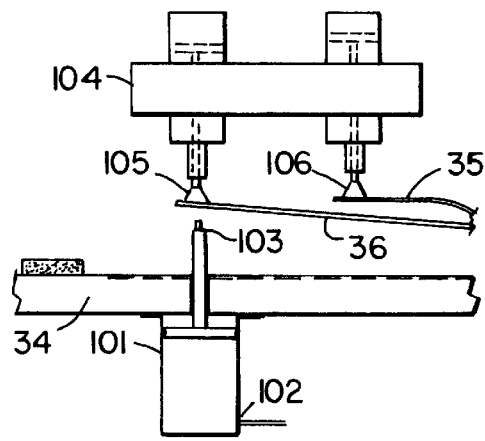
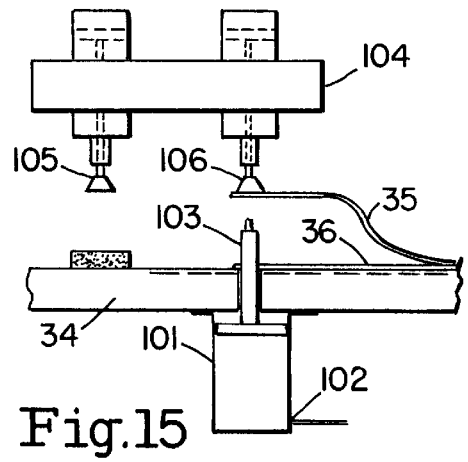

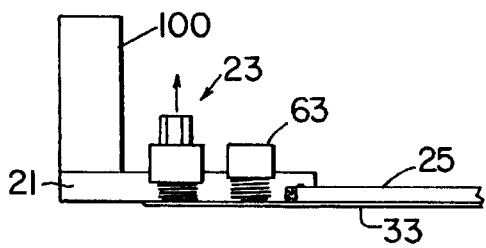
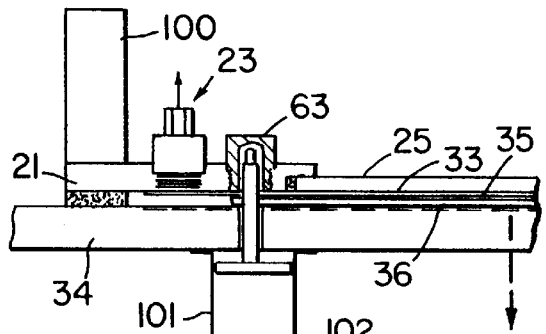
Fig.17
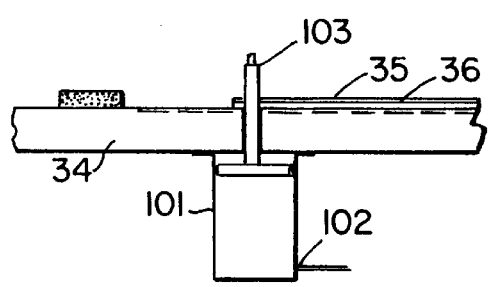
Fig.16
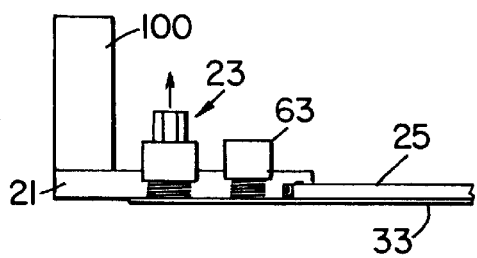
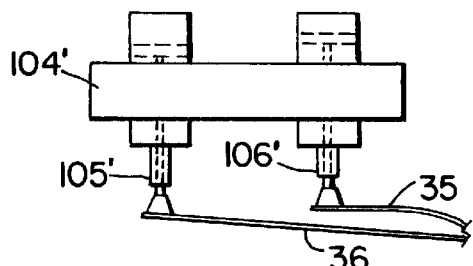
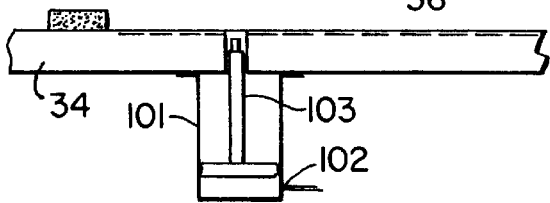
Fig.19
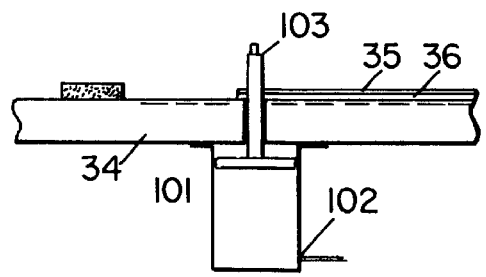
Fig.18
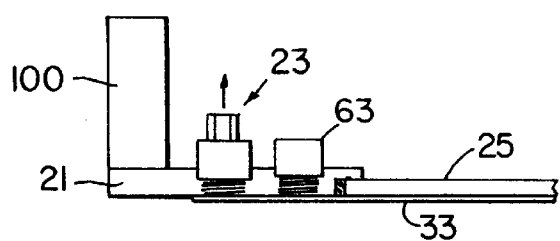
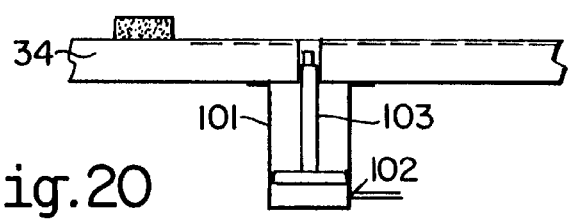
Fig.20

VACUUM EXPOSURE FRAME WITH UNWORKED GLASS INSERT/PLATE EXPOSER AND OPTIONALLY HAVING SEPARATE ID VIEWING AREA

BACKGROUND OF THE INVENTION

For the graphics and printing arts (such as lithography), it is often desired to automatically expose images from film negatives to a light sensitive aluminum printing plate using an ultraviolet light source.

At the infeed of a typical prior art exposure unit, a mask, film, and aluminum printing plates are stacked on two separate register pin systems; one for the mask and film, and the second system for the plates.

A prior art upper chase was a two-part design. It utilized PLEXIGLAS or other polycarbonate or the like in the exposure window area and vacuum towers. Aluminum was used to construct the chase section that attached the PLEXIGLAS assembly to the vertical moving support structure. The PLEXIGLAS and aluminum were sealed with foam rubber between. Assembled from above, the aluminum was at the bottom, then the foam seal, the PLEXIGLAS, and a retainer plate. The PLEXIGLAS was milled around the perimeter such that when set in place from above into the aluminum frame, the PLEXIGLAS was flush to the lower surface of the frame from below. The vacuum towers were countersunk into the plexiglass and held in place with an ultraviolet-curing adhesive. Thus, expensive PLEXIGLAS, vulnerable to scratching, and UV burn, was made further expensive by the border milling/routing and countersunk depression. Also, a PLEXIGLAS vacuum tower was cut out of laminations and drilled and adhesively attached to the PLEXIGLAS exposure panel. Glass retains its cleanness but is sensitive to stresses and has rarely been used for the exposure window. When used it was worked glass and required complex procedures to secure.

As far as operationally, a transfer arm first carries a mask into the exposure area. The mask is positioned on the image lineup register pin system, then the upper chase moves down, picks up the mask, and retains the mask during a preset count of exposures. As described above, the upper chase is constructed with towers holding vacuum lines that keep the mask in position. Next, a piece of film and a plate are carried via vacuum suction cups into the exposure area and placed on the image lineup register pin system. The exposure area platen is constructed of aluminum with machined channels for vacuum transfer evenly throughout the plate and film area. Once the plate and film are in position, the upper chase descends to create a seal with this lower platen. Vacuum is put on the sealed area drawing down the plate, film, and mask. Even pressure contact between the plate and film is critical at this point for accurate transfer of film image to the plate.

Outside the main image area, a written identification located between the register pins on the film is transferred from the film to the plate.

An ultraviolet light source is turned on to burn the image from the film to the plate. At this point the exposure is complete; the upper chase moves back up and the film and plate are removed from the exposure area by the exit transfer arm.

DISADVANTAGES OF THE PRIOR ART DESIGN

Replacing the original chase frame was very expensive for several reasons. First, PLEXIGLAS is much more expensive than glass. While more durable to side pressures it scratches easily. Additionally the PLEXIGLAS utilized in the old design had to be routed, PLEXIGLAS towers made, and the final piece/towers had to be assembled with adhesive. The entire PLEXIGLAS assembly was replaced when the exposure image area became scratched. The PLEXIGLAS laminate towers were very often knocked off during cleaning. Repair was time consuming because the old adhesive had to be removed prior to cementing the tower back on. The towers had to be installed with special ultraviolet curing adhesive with extra attention to creating a good seal. PLEXIGLAS requires special plastic polish for its cleaning. (Any glass cleaner can be used on glass). Also image area clarity does not deteriorate as rapidly with glass as with PLEXIGLAS.

PRIOR ART EFFORTS TO OVERCOME THE DISADVANTAGES

A review of some references in the area of lithographic printing apparatus, particularly for exposing lithographic plates to light via films discloses certain efforts in the area by Western Litho Plate & Supply Co. of St. Louis, Mont. (now called Western Lithotech, formerly a division of Bemis Corporation, now a Mitsubishi-Kasei Company).

U.S. Pat. No. 4,614,425 to Copeland et al., discloses the use of a glass light-transmitting panel 91 but which is secured to the frame by use of registration pins P3 and P4 which require that holes be drilled through the glass (see col. 5, 11. 16+).

U.S. Pat. No. 4,575,233 also to Copeland et al. discloses the same basic setup of the glass light transmitting panel 91 as in the '425 patent (see col. 5, 11. 19+).

U.S. Pat. No. 3,635,559 to Harrell et al. discloses the use of a glass light-transmitting panel which is secured to the frame by means of clips 85 and gasket 87. No holes apparently need to be drilled in the glass (see col. 3, 1. 63). A presser pad 63 is below the unit. A peripheral sealing strip 91 adhering in the bottom of panel 61 becomes in the closed position of the frame in sealing engagement with the pad. The presser pad 63 has an opening 117 therethrough constituting a vacuum port (col. 7, 1. 34). As a consequence of drawing the vacuum in this chamber, pad 63 is pressed upward by atmospheric air pressure on its bottom, thereby to press plate pad film F against the light-transmitting panel 61, so that the plate is ready for exposure. Plate 65 has a central hole 65a for entry of air to pass against the bottom of the pad.

SUMMARY OF THE INVENTION

The disadvantages of the prior art are believed overcome by the instant invention. The new upper chase design utilizes glass, preferably tempered, without any drilling, leveling or working of any sort instead of PLEXIGLAS. The vacuum nipple towers were removed from the image area and made of aluminum instead of laminated PLEXIGLAS. The underside of the aluminum frame has a routed groove outside the perimeter of the image area but inside the vacuum towers and register pins. The groove holds sealant used to secure the glass to the frame. The small vertical space between the glass edge and frame is also filled with sealant to secure the glass and metal frame surfaces, allow clearance for thermal expansion of dissimilar materials, and create an air tight seal. As stated above, the vacuum and pin towers are made of aluminum and threaded in to the frame. Separate small exposing windows are cut into the frame/with routed lips and PLEXIGLAS ID viewing windows are secured to the frame with sealant, the ID windows being in the area where in the film will have identification markings for the plate. These identification markings are located between two of the register pins outside the main image area.

Major improvements in cost effectiveness and quality are provided by the invention. Replacement parts required are less expensive and last longer. The PLEXIGLAS utilized in the old design had to be routed, PLEXIGLAS towers made, and the final piece assembled with special adhesive. The entire PLEXIGLAS assembly had to be replaced when the exposure image area became scratched. The new design employing an aluminum frame has aluminum towers threaded into the frame, and (tempered) unworked glass insert, instead of PLEXIGLAS, inserted in the print image window area. When the image area becomes scratched, the inexpensive glass insert is replaced. With one spare aluminum frame assembly, the glass can be installed or replaced in the spare frame without loss of production time. Installation of the aluminum frame assembly is also easier and faster than the original PLEXIGLAS assembly.

As stated above, the new design was subjected to certain informal tests and runs which proved that it operates longer with less downtime for frame replacements and vacuum tower repair. The PLEXIGLAS towers in the original design were often knocked off during cleaning. Repair was time consuming because the old adhesive has to be removed prior to cementing the prior art tower back on. The towers had to be installed with special ultraviolet curing adhesive with special attention to creating a good seal. The new design is much more durable because the towers are made of aluminum and are threaded into the frame, eliminating the possibility of knocking them off or sealing them improperly. Production time is gained with simplified cleaning requirements of the new design. Cleanliness of the image area is critical for quality transfer of image from film to plate. PLEXIGLAS requires special plastic polish; any glass cleaner can be used on the glass. Cleaning time is decreased and the process much easier. Quality is increased because the image area clarity does not deteriorate as rapidly.

The exposure frame is fabricated of aluminum. The vacuum and pin towers are made of durable aluminum and threadably secured into the frame itself. Separate exposing windows with PLEXIGLAS inserts secured therein are provided for film/plate ID identification. The glass is secured to the underside of the frame in a channel cut or routed around the inner circumference (formed aperture [inward] side) and preferably a reverse depression cut out of the horizontal underside surface of the channel. When assembled, the glass is flush with the frame underside. No special machining or any working is required on or to the glass. By securing the glass to the underside edge of the frame (by sealant adhesive) instead of: a) routing or cutting the glass and b) installing from the topside of the frame, no loss of tensile strength occurs to the glass.

OBJECTS OF THE INVENTION

It is thus an object of the invention to replace expensive scratch sensitive PLEXIGLAS with inexpensive unworked glass.

It is another object of the invention to replace PLEXIGLAS vacuum towers with aluminum vacuum towers.

It is still another object of the invention to separate the exposure of the book page images from the ID images so that the advantage of inexpensive glass (glass being consistently clearer than PLEXIGLAS) are associated with print images to be exposed and long lasting polycarbonate for the ID.

DESCRIPTION OF THE DRAWINGS

FIG. 4 is a plan view of a first embodiment of the instant invention showing the exposure frame enclosing an open aperture into which unworked glass is securely held and also showing two ID viewing windows containing PLEXIGLAS and the placement of registration pin component locations and vacuum connection component locations.

FIG. 4A shows a plan view of the exposure frame of the instant invention.

FIG. 4B shows the same as FIG. 4A but additionally shows the detail as to the use of threaded parts and associated fittings (section B—B).

FIG. 5A is a side sectional view A—A through the left member of the exposure frame showing a) the location of the underside routing with horizontal underside surface having a reverse depression b) vacuum connection component drillhole and chases-to frame bolthole (not through) drillout.

FIG. 5B is a side sectional view through a nonplanar path of a longitudinal frame member of the exposure frame going through the routed position on the lower underside aperture-facing portion of the frame and showing the reverse depression on the upper horizontal surface of said routed horizontal surface and additionally showing an ID window opening, a vacuum-fitting machined-out opening, and a chases-to frame bolthole out (but-not-through).

FIG. 5C (section C—C) is a side sectional view through a different nonplanar path of the same longitudinal frame member of the exposure frame going through the routed portion on the lower underside aperture-facing portion of the frame and showing the reverse depression on the upper horizontal surface of said routed horizontal surface and additionally showing threaded opening to contain threaded hollow fitting cup that will receive a register pin inserted from below, a vacuum fitting opening which will contain a vacuum fitting [said fitting will be hollow at its top to attach to a vacuum hose], and a chases-to-frame bolthole drill-out (but-not-through).

FIG. 6A shows the assembled fittings and unworked glass through section A—A described in FIG. 5A.

FIG. 6B shows the assembled fittings, glass and plexiglass through section B—B described in FIG. 5B.

FIG. 6C shows the assembled fittings, glass and PLEXIGLAS through section C—C described in FIG. 5C.

FIG. 7A shows the details of a register pin cap fitting.

FIG. 7B shows the details of a vacuum fitting which threads into the exposure frame via a threaded hole.

FIG. 7C shows the details of an inner vacuum fitting which threads into the vacuum fitting of FIG. 7B.

FIG. 8A shows a plan view of the exposure frame of the invention.

FIG. 8B shows an elevational section view across the shorter side of the exposure frame and showing the vacuum towers and register pin towers. Note they are not touching the exposure window (here of unworked glass).

FIG. 8C shows the greater details across the above-noted sections.

FIG. 8D shows the greater details of the prior art exposure frame across the equivalent section of FIG. 8C(2).

FIG. 9A shows a plan view of the typical plate when placed at the bottom of the process and showing the register pin holes associated.

FIG. 9B shows a plan view of a typical film having book page images when placed above and adjacent to said plate and also showing the placement of register pin holes and the ID which is on film.

FIG. 9C shows a plan view of a typical mask when placed above said film and adjacent to said glass and also showing the placement of register pin holes.

FIG. 10C shows the first step in the whole dynamic operation of plate exposure (copy of book pages in camera-produced film to be transferred to aluminum plate for long-run printing of paper from the inked plate) in which the transfer arm moves the mask having registration (mask defines the area of image exposure) into position by means of suction cups mounted on air cylinder such that the mask holes are directly over register pins which come out of recesses in the platen by means of compressed air which push up the register pins to overcome gravity.

FIG. 11 shows the mask having registration holes in position with the holes surrounded by the exposed extended platen registration pins.

FIG. 12 shows the upper chase holding the exposure frame moving down to meet the platen; vacuum associated with the frame suction cup starts to pick up the mask.

FIG. 13 shows the upper chase holding the exposure frame of the instant invention moving up and away from the platen where the mask is now being held securely by the exposure frame against the unworked glass.

FIG. 14 shows the transfer arm moving the plate and film, each having registration holes, into position over the corresponding platen registration pins with arm suction cups mounted on air cylinder holes and place the plate onto the platen such that the plate holes are entered by the platen registration pins. Again, note that the platen registration pins are extended above recess by means of compressed air to overcome gravity.

FIG. 15 shows the suction cups on the transfer arm place the film having registration holes onto the matching platen registration pins.

FIG. 16 shows the plate and film thereon mounted on the platen by means of the registration pins; the transfer arm has moved away and now the upper chase/exposure frame with vacuum-held mask has been moved into the READY POSITION.

FIG. 17 shows the upper chase/exposure frame in the DOWN/CONTACT position with the platen vacuum turned on to draw down the mask and film to the plate. Note that the unworked-glass is in contact with the upper side of the mask. Also note that the frame vacuum is also holding the mask in place.

FIG. 18 shows the upper chase exposure frame moved up away from the platen with the vacuum turned off on the lower platen but the vacuum holding the mask to the lower side of the unworked glass still on. Note that the film and plate are still on the platen by use of the extended registration pins.

FIG. 19 shows the registration pins on the platen retracted into their recesses by turning off their compressed air supply with the transfer arm having suction cups with one cup picking up the film and the other cup picking up the plate underneath the film.

FIG. 20 shows the upper chase/exposure frame with vacuum-held mask back in the READY position awaiting the next plate/film set during the time that the transfer arm is moving the just exposed plate and associated film to the delivery conveyor.

DETAILED DESCRIPTION

Figure 1:
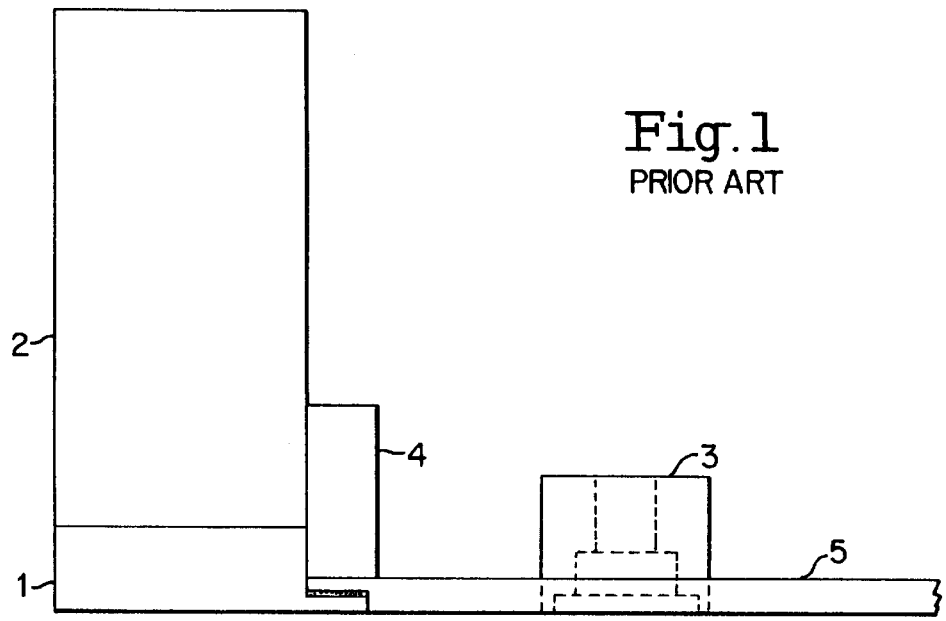
FIG. 1 is a front elevational view of an exposure frame of the prior art showing the transparent window material of PLEXIGLAS.

FIG. 1 is a front elevational view of an exposure frame of the prior art showing the transparent window material of PLEXIGLAS.

Note that vacuum nipple tower 3 is drilled into the PLEXIGLAS 5. The exposure frame 1 is attached to the upper chase 2 with retaining block 4 assisting the securing of the window.

Figure 2:
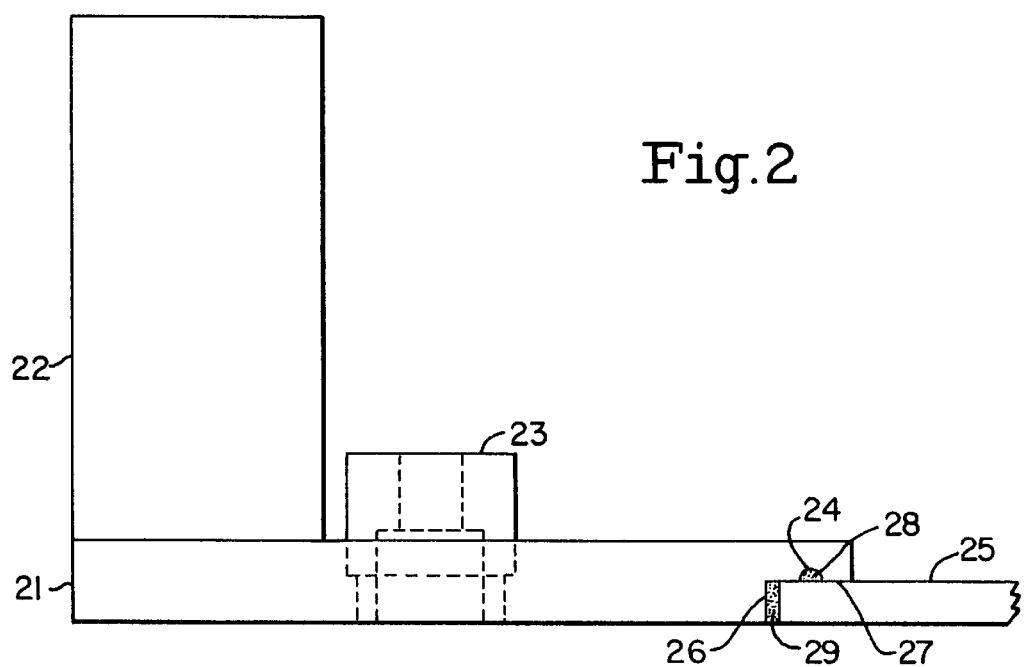
FIG. 2 is a front elevational view of an exposure frame in accordance with the invention showing the transparent window material of unworked glass, the routing on the underside of the frame, and the reverse depression on the upper horizontal surface of the routed frame, with sealant-adhesive inserted between the glass and the frame on the vertical surface of the routed frame and in the reverse depression—said sealant—adhesive holding the unworked glass securely in the frame.

FIG. 2 is a front elevational view of an exposure frame in accordance with the invention showing the transparent window material of unworked glass, the routing on the underside of the frame, and the reverse depression on the upper horizontal surface of the routed frame, with sealant-adhesive inserted between the glass and the frame on the vertical surface of the routed frame and the reverse depression—said sealant—adhesive holding the unworked glass securely in the frame.

Note that frame 21 is secured to chase 22. Vacuum nipple tower 23 is drilled into the frame. The window portion of the frame is shown in section. The aperture-facing portion of the frame is routed out of the lower portion and the routing shown has vertical wall 26 and horizontal wall 27. A reverse depression 24 of semicircular cross-section is routed out of the horizontal surface 27. Securing the unworked glass 25 to the frame is by means of a sealant adhesive 28 being inserted into reverse depression 24 to hold up the unworked glass 25 against the forces of gravity while a sealant adhesive 29 secures the unworked glass with the frame borders defined by routed vertical sides 26.

Figure 3:
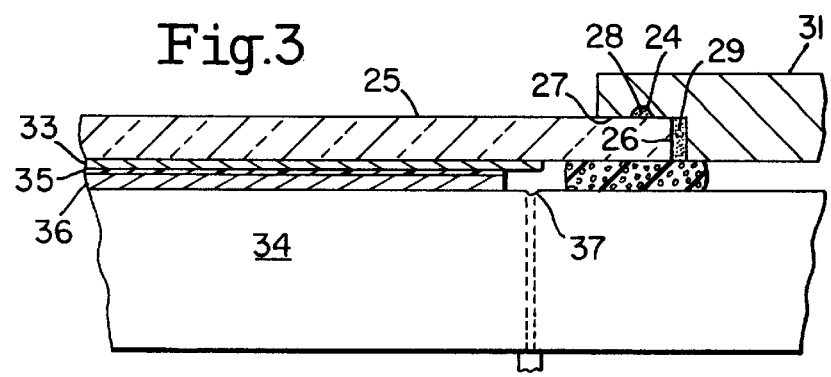
FIG. 3 is a front elevational view showing the exposure frame of the invention holding the mask securely against the lower surface of the unworked glass with the film held by vacuum and adjacent thereto the plate and platen assembly meeting the exposure frame.

FIG. 3 is a front elevational view showing the exposure frame of the invention holding the mask securely against the lower surface of the unworked glass with the film held by vacuum and adjacent thereto the plate and platen assembly meeting the exposure frame.

This view shows the sectional view when the chase with frame holding the mask 33 meets the platen 34 having the film 35 over aluminum exposure plate 36 in place.

The exposure frame 41 having the configuration of the previously described embodiment holding unworked glass 25 is also shown.

FIG. 4A is a plane view of a first embodiment of the instant invention showing the exposure frame enclosing an open aperture into which unworked glass is securely held and also showing two ID viewing windows containing PLEXIGLAS and the placement of registration pin component locations and vacuum connection component locations.

FIG. 4A shows a plan view of the exposure frame 41 of the instant invention. Separate PLEXIGLAS ID windows 42 are shown near the main print window 25. Threaded holes 44 will hold the vacuum tower fittings 62/61. Sections A—A, B—B, and C—C are shown. Threaded holes 43 hold the registration pin caps 63. Depression drill outs 45 do not go through and are used for bolting the frame to the chase. The underside routings along the underside of the aperture print window of the frame are shown in hidden line form.

FIG. 4B shows the same as FIG. 4A but additionally shows the details as to the use of threaded parts and associated fittings.

FIG. 5A is a side sectional view A—A through the left member of the exposure frame showing a) the location of the underside routing 26,27 with horizontal underside surface having a reverse depression, b) vacuum connection component drillhole 44 and frame/chase bolt drillout 45.

Also shown is reverse depression 24 on the upper horizontal surface of the routing. A bolt going through the chase and then partially into the frame through threaded drillout 45 secures the frame to the chase. Threaded drillout with countersunk top 44 serves as the threaded base for securing the vacuum tower fittings (62 into 61).

FIG. 5B (section B—B) is a side sectional view through a nonplanar path of a longitudinal frame member of the exposure frame going through the routed portion of the lower underside aperture-facing portion of the frame and showing the reverse depression on the upper horizontal surface of said routed horizontal surface and additionally showing an ID window opening, a vacuum-fitting machined-out opening, and a chase/frame bolthole drill-out (but-not-through).

Shown in FIG. 5B are routed exposure window boundary surfaces 26, 27 with reverse depression 24 in the upper surface of horizontal surface 27. Also shown is PLEXIGLAS ID window 42, threaded vacuum fitting holes 44 and frame-to-chase securing threaded bolt hole 45 which does not go all the way through.

FIG. 5C (section C—C) is a side sectional view through a different nonplanar path of the same longitudinal frame member of the exposure frame going through the routed portion on the lower underside aperture-facing portion of the frame and showing the reverse depression 24 on the upper horizontal surface of said routed horizontal surface 27 and additionally showing threaded opening 43 to contain threaded hollow fitting cup 63 that will receive a register pin inserted from below, a vacuum fitting opening 44 which will contain a vacuum fitting (62 into 61 [said fitting will be hollow at its top to attach to a vacuum hose]), and a frame-to-chase drill-out 45 (but-not-through).

FIG. 6A shows the assembled fittings and unworked glass through section A—A described in FIG. 5A.

Vacuum fitting 23 which is comprised of fitting 62 which screws into fitting 61 with 61 being screwed in first into threaded hole 44.

A bolt from above through the chase and then into the frame to secure the frame to the chase goes into threaded depression 45.

FIG. 6B shows the assembled fittings, glass, and PLEXIGLAS through section B—B described in FIG. 5B.

PLEXIGLAS ID window 42 is secured into the frame with adhesive. Vacuum fitting 23, comprised of fitting 62 screwed into fitting 61, is secured to the frame by screwing the outside threads of 61 into threaded hole 44. Threaded bolt hole 45 permits the securing of the frame to the chase by means of a bolt through an appropriate hole in the chase.

FIG. 6C shows the assembled fittings, glass, and PLEXIGLAS through section C—C described in FIG. 5C.

Registration pin cap fitting 63 is threaded into frame threaded hole 43. Vacuum fitting 23, as previously described, is threaded into frame threaded hole 44. Threaded bolthole 45 secures the frame to the chase by means of a threaded bolt.

FIG. 7A shows the details of a register pin cap fitting 63.

FIG. 7B shows the details of a vacuum fitting 61 which threads into the exposure frame hole 44.

FIG. 7C shows the details of an inner vacuum fitting 62 which threads into the vacuum fitting 61 of FIG. 7B.

FIG. 8A shows a plan view of the exposure frame of the invention.

Showing the location of the register pin cup location 43, the vacuum tower fitting locations 44, and the frame-to-chase securing bolthole locations 45.

FIG. 8B shows an elevational section view across the shorter side of the exposure frame and showing the vacuum towers and register pin towers. Note they are not touching the exposure windows (here of unworked glass).

FIGS. 8C(1) and 8C(2) shows the greater details across the above-noted sections.

FIG. 8D shows the greater details of the prior art exposure frame across the equivalent plan section of FIG. 8C(2).

FIG. 9A shows a plan view of the typical plate when placed at the bottom of the process and showing the register pin holes associated.

FIG. 9B shows a plan view of a typical film having book-page images when placed above and adjacent to said plate and also showing the placement of register pin holes and the ID which is on the film.

FIG. 9C shows a plan view of a typical mask when placed above said film and adjacent to said glass and also showing the placement of register pin holes 945.

Figure 10A:
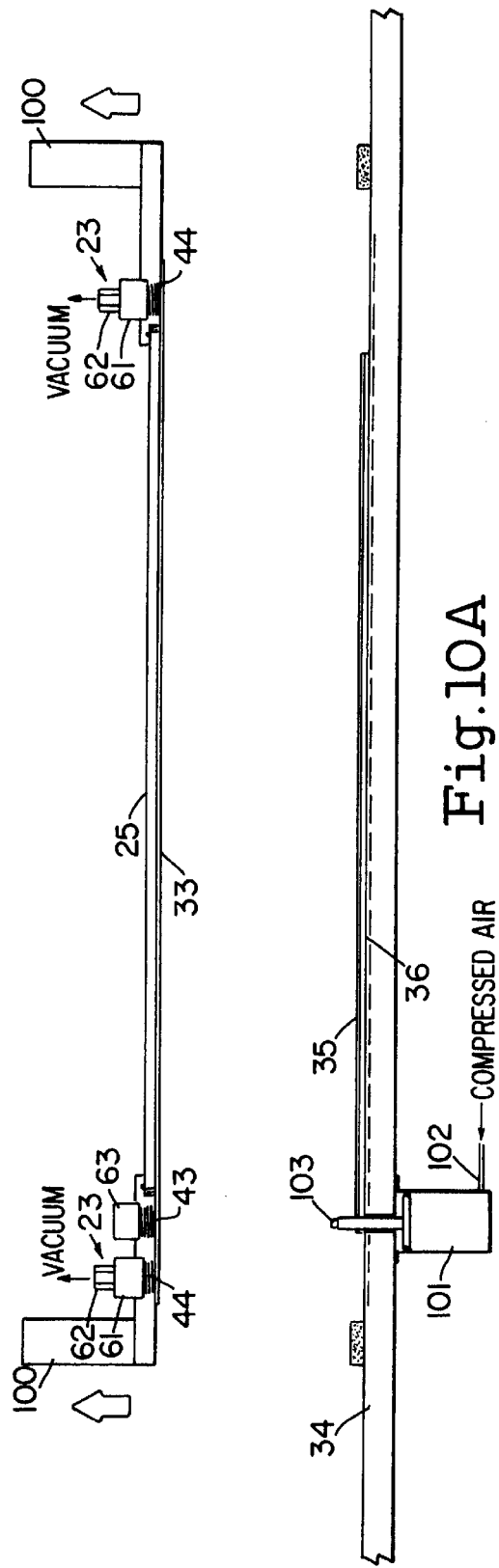
FIG. 10A shows the upper chase holding the exposure frame holding the mask in non-contact position over the platen holding the film and exposure plate before/after contact between the two.

FIG. 10A shows the upper chase 100 holding the exposure frame holding the mask in non-contact position over the platen 34 holding the film and exposure plate before/after contact between the two.

Note that registration pin 103 is in a piston chamber 101 which is attached to a compressed air supply 102. When compressed air is supplied to the piston the registration pin 103 comes out of its recess in the piston. Aluminum exposure printing plate 36 is on top of platen 34 with film 35 above it. Both the film and plate are held in position on the platen by holes in the film and plate which mate with the registration pins 103.

Figure 10B:
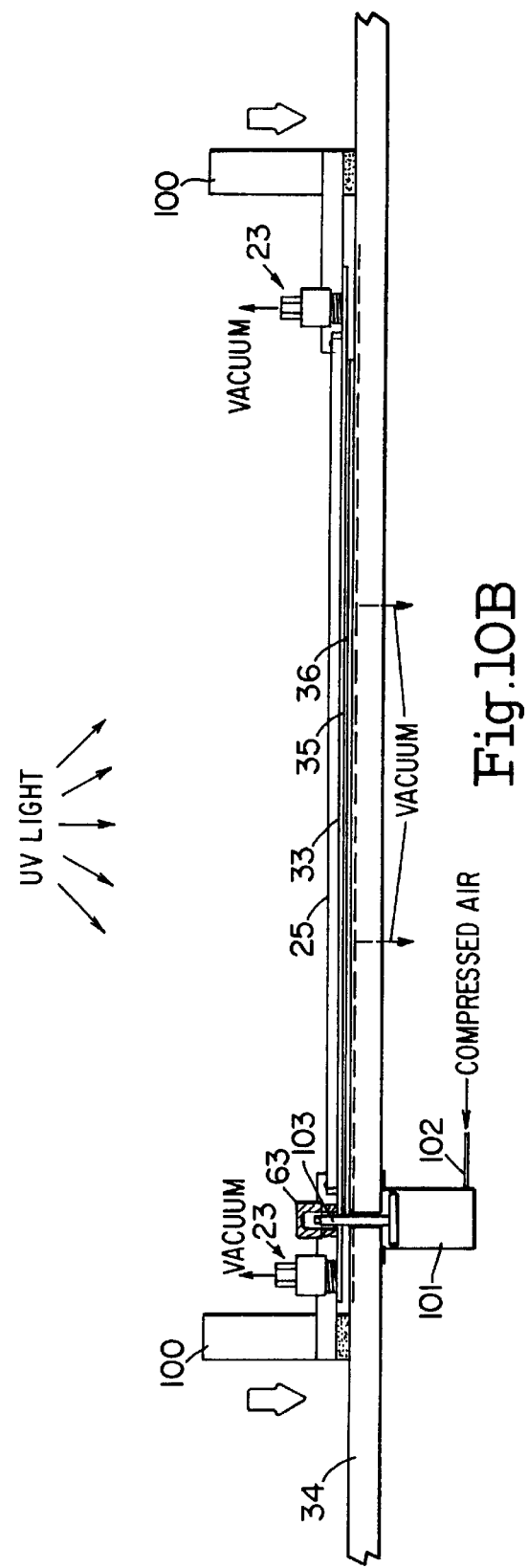
FIG. 10B shows the upper chase holding the exposure frame holding the mask in contact position with the platen holding the film and exposure plate.

FIG. 10B shows the upper chase holding the exposure frame holding the mask in contact position with the platen 34 holding the film 35 and exposure plate 36.

FIG. 10C shows the first step in the whole dynamic operation of plate exposure (copy of book pages with ID in camera-produced film with said pages to be transferred to said aluminum plate for long run printing of paper from the inked plate) in which the transfer arm 104 moves the mask having registration holes (mask defines the area of image exposure) into position by means of suction cups 105, 106 mounted on air cylinder 101 such that the mask holes are directly over register pins 103 which come out of recesses in the platen 34 by means of compressed air which push up the register pins to overcome gravity.

FIG. 11 shows the mask 33 having registration holes in position with the holes surrounded by the exposed extended platen registration pins 103.

FIG. 12 shows the upper chase 100 holding the exposure frame 21 moving down to meet the platen 34; vacuum associated with the frame suction cup starts to pick up the mask 33.

FIG. 13 shows the upper chase 100 holding the exposure frame of the instant invention moving up and away from the platen 34 where the mask 33 is now being held securely by the exposure frame against the unworked glass 25.

FIG. 14 shows the transfer arm 104 moving the plate 36 and film 35, each having registration holes, into position over the corresponding platen registration pins 103 with arm suction cups 105, 106 mounted on air cylinder hold and place the plate onto the platen 34 such that the plate holes are entered by the platen registration pins 103. Again note that the platen registration pins 103 are extended above recess by means of compressed air to overcome gravity.

FIG. 15 shows the suction cups 105, 106 on the transfer arm 104 place the film 35 having registration holes onto the matching platen registration pins 103.

FIG. 16 shows the plate 36 and film 35 thereon mounted on the platen 34 by means of the registration pins 103; the transfer arm 104 has moved away and now the upper chase 100/exposure frame 21 with vacuum-held mask 33 has been moved in the READY POSITION.

FIG. 17 shows the upper chase 100/exposure frame 21 in the DOWN/CONTACT position with the platen vacuum turned on to draw down the mask and film to the plate. Note that the unworked-glass 25 is in contact with the upper side of the mask 33. Also note that the frame vacuum 23 is also holding the mask in place.

FIG. 18 shows the upper chase 100/frame 21 moved up away from the platen 34 with the vacuum turned off on the lower platen but the vacuum holding the mask 33 to the lower side of the unworked glass 25 still on. Note that the film 35 and plate 36 are still on the platen 34 by use of the extended registration pins 103.

FIG. 19 shows the registration pins 103 on the platen 34 retracted into their recesses by turning off their compressed air supply 102 with the transfer arm 104' having suction cups 105', 106' with one cup picking up the film 35 and the other cup picking up the plate underneath the film.

FIG. 20 shows the upper chase 100/exposure frame 21 with vacuum-held mask back in the ready position waiting the next plate/film set during the time that the transfer arm is moving the just exposed plate and associated film to the delivery conveyor.

BEST MODE

As noted above, preferably a reverse depression should also be routed out of the upper horizontal surface of the routed channel to provide a place where sealant-adhesive- could hold the unworked glass in the vertical sense channel to counter the effects of gravity with the minimal use of adhesive. In this manner the glass is secured (by adhesive) to the frame in both the horizontal and vertical planes and thus maximizing the insensitivity of the glass to movements while in the frame which would be moving dynamically. Preferably the glass is tempered.

The plate exposure frame which is the subject of this invention is used in a plate exposing mechanical system which will result in production of multiple films for use in lithographic printing, usually for the printing of pages of a book—each film usually being 8 or 10 pages of a book.

The frame is secured to a moving chase. As noted above there are two register pin systems. One for moving the mask and film sets and the other to carry each plate. The mask is positioned on the image lineup register pin system, then the upper chase moves down, picks up the mask. (Exhibit A) Next a piece of film and a plate are carried via vacuum suction cups into the exposure area of the machine and placed on the image lineup register pin system. Once the plate and film are in position, the upper chase descends to create a seal with the lower platen. Vacuum is put on the sealed area, drawing down the plate, film, and mask. (see Exhibit B FIG. 10B) Even contact between the plate and film is critical at this point for accurate transfer of film image to plate. Outside the main image area, a written ID identification located between the register pins is transferred from the film to the plate by means of an ultraviolet light source which is turned on to burn the image from the film onto the plate. At this point the exposure is complete. The upper chase containing the inventive frame is moved back up (see Exhibit C, FIG. 10A) and the film and plate are removed from the exposure area by the exit transfer arm. As noted above, the glass is unworked, permitting inexpensive replacement when needed but using the superior image transmission clarity of and through glass as compared to that of polycarbonates. Separate ID window(s) having polycarbonate sheet inset utilize the superior longevity and insensitivity to stresses of polycarbonate but recognized and accept the reality that polycarbonates have less image transmission clarity and are more susceptible to scratches. Further towers of aluminum mechanically secured to the frame itself result in increased life over towers of polycarbonate. Further appropriate placement not involving the windows further increases their life cycle.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

We claim:

1. An improvement in an exposure frame useful in lithography and the printing arts wherein said frame is required to withstand
   (a) movement of said frame, and
   (b) a vacuum means, wherein said frame has a film exposure window, said vacuum means holds a film firmly against said film exposure window,
   the improvement being
      i) that said film exposure window is made of unworked glass and through which copy is exposed, and
      ii) that there is at least one other separate exposure window having an insert made of polycarbonate and through which identification information is exposed.

2. The invention of claim 1, further comprising at least one aluminum vacuum tower to secure materials to the film exposure window, said tower secured to said frame.

3. A camless exposure holding frame useful in lithography and the printing arts for holding unworked glass in place on the lower side of but within said frame, said frame having an upper side, a lower side and an open aperture within said frame, said frame having a through cross section which is routed on the lower side of said frame along the open aperture, said routing having a plurality of surfaces not in the same plane, one of said surfaces having an upper side and a reverse depression, said depression is itself routed out of said upper side of said routed surface, and wherein a sealant adhesive applied to fill the reverse depression and applied to at least another part of said routed surface securely holds said unworked glass placed in said open aperture.

4. The invention of claim 3 wherein said plurality of surfaces comprises two planar adjacent surfaces which are 90 degrees to each other.

5. The invention of claim 4 further comprising at least one ID aperture in addition to the aperture for unworked glass and wherein an insert of polycarbonate substantially fills and is secured within said at least one ID aperture.

6. The invention of claim 4 wherein said sealant adhesive is applied to one of the two planar surfaces which is parallel to the aperture facing sides of said frame.

7. The invention of claim 6 wherein said one surface is horizontal.

8. The invention of claim 6 wherein said one surface is vertical.

9. The invention of claim 3 wherein said sealant adhesive is highly flowable self leveling silicone.

10. The invention of claim 3 wherein said unworked glass is tempered.

11. The invention of claim 3 further comprising vacuum towers to secure exposure materials to said glass, said towers secured to said frame.

12. The invention of claim 11 wherein said vacuum towers are threadably secured to said frame outside of said open aperture.

13. The invention of claim 3 wherein said frame further comprises at least one ID aperture separate from said open aperture.

14. A vacuum exposure frame and platen assembly for use in making exposed printing or lithographic plates, using a discrete mask sheet, a film sheet and a plate sheet, said assemblies comprising:

a platen for holding the plate;

registering pins associated with the platen for penetrating the mask, film and plate sheets to register the same;

a metal frame having an upper side and a lower side and having an open window in the frame extending between the upper and lower sides of the frame;

a peripheral portion of the metal frame adapted to be attached to a chase;

a routing in the lower side of the frame surrounding the window;

an unworked glass positioned in the window with peripheral edges of the glass positioned in the routing;

a lower side on the glass being flush with the lower side of the frame to receive and hold a mask flat thereagainst;

a sealant-adhesive in said routing for adhering the glass to the frame and for creating an air-tight seal therebetween;

a vacuum tower located inwardly of the peripheral portion for the chase and mounted on the upper side of the exposure frame for connection to a vacuum source to hold the mask firmly in place against the lower side of the glass; and pin towers mounted on the upper side of the metal frame and outside of the glass, to receive registering pins for registration of the plate, film and mask sheets relative to the metal frame.

15. The invention of claim 14, wherein said unworked glass is tempered.

16. The invention of claim 14, further comprising an exposing window for identification markings in the exposure frame being made of polycarbonate.

17. The invention of claim 14, wherein the vacuum tower is made of aluminum, and threads on the vacuum tower and on the metal exposure frame being engaged to secure the vacuum tower to the exposure plate.

18. A vacuum exposure frame in accordance with claim 14 wherein a reverse depression is routed out in a horizontal face of the routing; and a sealant-adhesive is disposed in said reverse depression to adhere the glass to the metal frame.

19. A vacuum exposure frame in accordance with claim 18 wherein a sealant-adhesive is disposed between a vertical face in the routing and an adjacent edge of the glass.

20. A vacuum exposure frame for mounting on a chase and movable thereby for use in making exposed printing or lithographic plates, said frame comprising:

a metal frame having an upper side and a lower side and having an open window in the frame extending between the upper and lower sides of the frame;

a routing in the lower side of the frame and having a vertical face and a horizontal face surrounding the window;

an unworked glass positioned in the window with peripheral edges of the glass positioned in the open window;

a lower side on the glass being flush with the lower side of the frame to receive and hold a mask flat thereagainst;

at least one pin tower on the metal frame to receive registering pins for registration of the plate;

a vacuum tower mounted on the upper side of the exposure frame connection to a vacuum source to hold the mask firmly in place against the lower side of the glass; and an identification exposure window in said metal frame located at predetermined positions in the metal frame with respect to the registration pin tower to allow identification information to be transferred to the plate adjacent image.

21. The invention of claim 20, further comprising that said identification exposure window in said frame has an insert, said insert is made of polycarbonate.

22. The invention of claim 20 wherein a sealant adhesive is used to mount the glass to the metal frame.

23. The invention of claim 20 wherein said unworked glass is tempered.

24. The invention of claim 20 further comprising a plurality of vacuum towers made of aluminum.

* * * * *